US010788525B2

(12) United States Patent
Hiura et al.

(10) Patent No.: US 10,788,525 B2
(45) Date of Patent: Sep. 29, 2020

(54) SEMICONDUCTOR DEVICE, MEASUREMENT DEVICE, MEASUREMENT METHOD, AND SEMICONDUCTOR SYSTEM FOR PLASMA INDUCED DAMAGE (PID) MEASUREMENT

(71) Applicant: SONY CORPORATION, Tokyo (JP)

(72) Inventors: Yohei Hiura, Kanagawa (JP); Hidetoshi Oishi, Kanagawa (JP); Shigetaka Mori, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 145 days.

(21) Appl. No.: 16/064,118

(22) PCT Filed: Dec. 22, 2016

(86) PCT No.: PCT/JP2016/088380
§ 371 (c)(1),
(2) Date: Jun. 20, 2018

(87) PCT Pub. No.: WO2017/119319
PCT Pub. Date: Jul. 13, 2017

(65) Prior Publication Data
US 2019/0004101 A1 Jan. 3, 2019

(30) Foreign Application Priority Data
Jan. 8, 2016 (JP) ................................ 2016-002519

(51) Int. Cl.
*G01R 29/10* (2006.01)
*G01R 31/28* (2006.01)
(Continued)

(52) U.S. Cl.
CPC .......... *G01R 29/10* (2013.01); *G01R 31/2621* (2013.01); *G01R 31/2884* (2013.01); *H01L 22/34* (2013.01)

(58) Field of Classification Search
CPC ......... G01R 29/10; G01R 31/28; H01L 21/66; H01L 21/822; H01L 27/04
(Continued)

(56) References Cited

U.S. PATENT DOCUMENTS 6,353,235 B1 * 3/2002 Watanabe ............... H01L 22/34
257/48
8,193,824 B2 * 6/2012 Weng ...................... H01L 22/34
324/750.01
(Continued)

FOREIGN PATENT DOCUMENTS

JP 2002-313866 A 10/2002

OTHER PUBLICATIONS

Kuhn, et al., "Process Technology Variation", IEEE Transactions on Electronic Devices, vol. 58, Issue 8, Aug. 2011, pp. 2197-2208.
(Continued)

*Primary Examiner* — Vinh P Nguyen
(74) *Attorney, Agent, or Firm* — Chip Law Group

(57) ABSTRACT

Provided is a semiconductor device, a measurement device, a measurement method, and a semiconductor system that enable accurate measurement of the plasma induced damage (PID) effect on a small scale. The semiconductor device includes an NMOSFET whose gate is connected to an antenna part that functions as an antenna in a plasma process and a PMOSFET that controls the connection between the NMOSFET and a ring oscillator. The semiconductor device is provided with a test element group (TEG) that includes an NMOSFET whose gate is connected to an antenna part that functions as an antenna in a plasma process and a PMOSFET that controls the connection between the NMOSFET and a ring oscillator.

13 Claims, 6 Drawing Sheets

(51) Int. Cl.
   *G01R 31/26* (2020.01)
   *H01L 21/66* (2006.01)
(58) Field of Classification Search
   USPC .......................................................... 324/647
   See application file for complete search history.

(56) References Cited

U.S. PATENT DOCUMENTS

| 9,350,295 | B2* | 5/2016 | Kamata | ................... | H03C 1/36 |
| 2009/0056627 | A1* | 3/2009 | Shuto | ..................... | C23C 16/52 |
| | | | | | 118/712 |
| 2010/0315114 | A1* | 12/2010 | Pelgrom | ............ | G01R 31/2884 |
| | | | | | 324/762.01 |

OTHER PUBLICATIONS

International Search Report and Written Opinion of PCT Application No. PCT/JP2016/088380, dated Mar. 21, 2017, 6 pages of ISRWO.

* cited by examiner

SEMICONDUCTOR DEVICE, MEASUREMENT DEVICE, MEASUREMENT METHOD, AND SEMICONDUCTOR SYSTEM FOR PLASMA INDUCED DAMAGE (PID) MEASUREMENT

CROSS REFERENCE TO RELATED APPLICATIONS

This application is a U.S. National Phase of International Patent Application No. PCT/JP2016/088380 filed on Dec. 22, 2016, which claims priority benefit of Japanese Patent Application No. JP 2016-002519 filed in the Japan Patent Office on Jan. 8, 2016. Each of the above-referenced applications is hereby incorporated herein by reference in its entirety.

TECHNICAL FIELD

The present disclosure relates to a semiconductor device, a measurement device, a measurement method, and a semiconductor system, and more particularly to a semiconductor device, a measurement device, a measurement method, and a semiconductor system that enable, on a small scale, accurate measurement of the effect of plasma induced damage (PID) on the characteristics of the threshold voltage of a transistor.

BACKGROUND ART

PID is damage caused by a plasma process that is used for forming wires in a semiconductor device and forming vias connecting wires. A wire or via connected mainly to the gate of a metal-oxide-semiconductor field-effect transistor (MOSFET) functions as an antenna and gathers charges during the plasma process, and the gathered charges flow into the gate insulating film to cause PID.

If the threshold voltage Vth of the MOSFET fluctuates due to the PID and the characteristics of the threshold voltage Vth deviate from the range of characteristic variations considered at the time of designing, the operation of the semiconductor device cannot be guaranteed. Therefore, it is necessary to make it possible to guarantee the operation of the semiconductor device by accurately measuring the effect of PID on the characteristics of the threshold voltage Vth (hereinafter referred to as the PID effect) and creating a circuit design or the like in consideration of optimization of the process conditions and device structure and of fluctuations in the threshold voltage Vth on the basis of the measurement result.

In order to accurately measure the PID effect, it is desirable to arrange a test element group (TEG) in a semiconductor chip.

An exemplary structure of a TEG for measuring the PID effect has a plurality of MOSFETs whose gates are connected to antenna parts (details will be described later) having different area ratios with respect to the gates, and has a pad (PAD) connected by wires to the gate, source, and drain of each MOSFET and to each terminal of the substrate. The measurement of the PID effect with this structure is performed by directly determining the threshold voltage Vth of each MOSFET from the dependence, on the gate voltage, of the drain current of each MOSFET serving as a device under test (DUT), for example.

In this structure, however, the area per DUT is large since pads are connected to the gates, sources, and drains of the respective MOSFETs and to the respective terminals of the substrate. Therefore, it is difficult to arrange a TEG in a semiconductor chip. Note that each of the antenna parts is a wire or via that functions as an antenna in a plasma process.

Meanwhile, a structure has been devised for monitoring the characteristics of DUT from the oscillation frequency of a ring oscillator by inserting MOSFETs as a plurality of DUT in parallel between the Vcc terminal of the ring oscillator and the Vcc wire and between the Vss terminal of the ring oscillator and the Vss wire (see, for example, Non-Patent Document 1). In this structure, since a plurality of DUT is connected in parallel and one of them is selected, the area per DUT is small. Therefore, the invention described in Non-Patent Document 1 arranges a plurality of such structures in a semiconductor chip, thereby evaluating variations in the characteristics of the MOSFETs within the semiconductor chip and on the wafer surface.

CITATION LIST

Non-Patent Document

Non-Patent Document 1: Kelin J. Kuhn et al., "Process Technology Variation" IEEE TRANSACTIONS ON ELECTRON DEVICES VOL. 58 NO. 8, AUGUST 2011

SUMMARY OF THE INVENTION

Problems to be Solved by the Invention

However, a reduction in TEG area is not taken into account in using the structure of Non-Patent Document 1 as the structure of a TEG for measuring the PID effect. Moreover, in a case where the structure of Non-Patent Document 1 is simply used as the structure of a TEG for measuring the PID effect, it is difficult to accurately measure the PID effect.

The present disclosure has been made in view of such a situation, and an object thereof is to enable accurate measurement of the PID effect on a small scale.

Solutions to Problems

A semiconductor device according to a first aspect of the present disclosure is a semiconductor device including: a measuring transistor whose gate is connected to an antenna part that functions as an antenna in a plasma process; and a switch transistor that controls connection between the measuring transistor and a ring oscillator.

According to the first aspect of the present disclosure, the measuring transistor whose gate is connected to the antenna part that functions as the antenna in the plasma process and the switch transistor that controls the connection between the measuring transistor and the ring oscillator are provided.

A measurement device according to a second aspect of the present disclosure is a measurement device including: a switch transistor control unit that turns on a switch transistor of a semiconductor device, the semiconductor device including: a measuring transistor whose gate is connected to an antenna part that functions as an antenna in a plasma process; and the switch transistor that controls connection between the measuring transistor and a ring oscillator; a measurement unit that measures an oscillation frequency output from the ring oscillator when the switch transistor is turned on by the switch transistor control unit; and an output unit that outputs a difference between the oscillation frequency measured by the measurement unit and an ideal value of the oscillation frequency.

A measurement method according to the second aspect of the present disclosure corresponds to the measurement device according to the second aspect of the present disclosure.

According to the second aspect of the present disclosure, the switch transistor of the semiconductor device is turned on, the semiconductor device including: the measuring transistor whose gate is connected to the antenna part that functions as the antenna in the plasma process; and the switch transistor that controls the connection between the measuring transistor and the ring oscillator, the oscillation frequency output from the ring oscillator when the switch transistor is turned on is measured; and the difference between the measured oscillation frequency and the ideal value of the oscillation frequency is output.

A semiconductor system according to a third aspect of the present disclosure is a semiconductor system including: a semiconductor device having: a measuring transistor whose gate is connected to an antenna part that functions as an antenna in a plasma process; and a switch transistor that controls connection between the measuring transistor and a ring oscillator; and a measurement device having: a switch transistor control unit that turns on the switch transistor of the semiconductor device; a measurement unit that measures an oscillation frequency output from the ring oscillator when the switch transistor is turned on by the switch transistor control unit; and an output unit that outputs a difference between the oscillation frequency measured by the measurement unit and an ideal value of the oscillation frequency.

According to the third aspect of the present disclosure, the semiconductor device has: the measuring transistor whose gate is connected to the antenna part that functions as the antenna in the plasma process; and the switch transistor that controls the connection between the measuring transistor and the ring oscillator, and the measurement device turns on the switch transistor of the semiconductor device, measures the oscillation frequency output from the ring oscillator when the switch transistor is turned on, and outputs the difference between the measured oscillation frequency and the ideal value of the oscillation frequency.

Effects of the Invention

The first to third aspects of the present disclosure enable accurate measurement of the PID effect on a small scale.

Note that the effects described herein are not necessarily limited, and any of the effects described in the present disclosure may be obtained.

BRIEF DESCRIPTION OF DRAWINGS

FIG. 2 is a diagram for explaining the operation performed when an NMOSFET of FIG. 1 is on.

MODE FOR CARRYING OUT THE INVENTION

Hereinafter, a premise of the present disclosure and a mode (hereinafter referred to as an embodiment) for carrying out the present disclosure will be described. Note that the description will be provided in the following order.

0. Premise of the Present Disclosure (FIGS. 1 and 2)
1. One Embodiment: Semiconductor System (FIGS. 3 to 6)

<Premise of the Present Disclosure>

(Example of Circuit Configuration of TEG)

Figure 1:
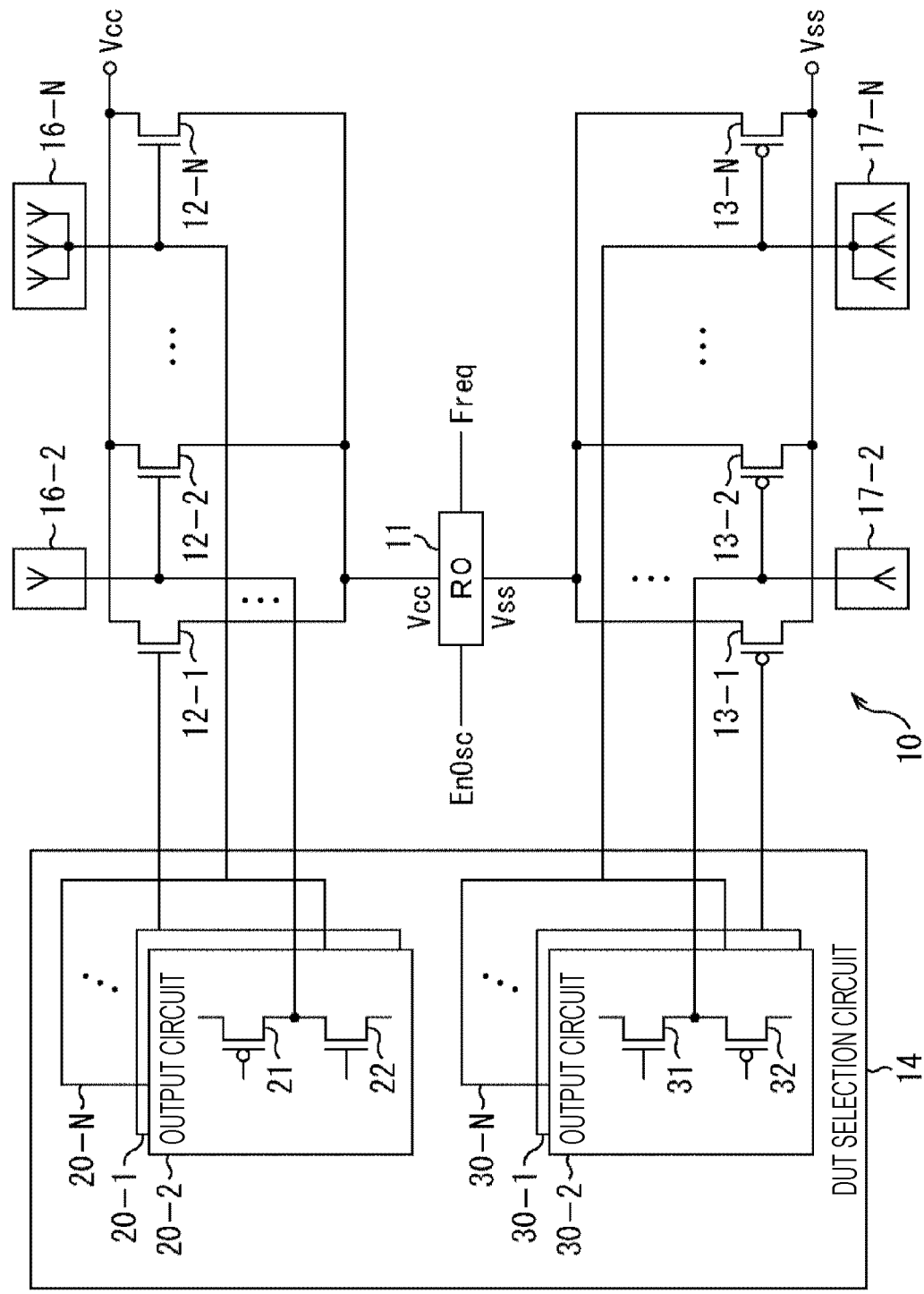
FIG. 1 is a diagram illustrating an example of a circuit configuration of a TEG.

FIG. 1 is a diagram illustrating an example of a circuit configuration of a TEG for the case where the structure of Non-Patent Document 1 is simply used as the structure of a TEG for measuring the PID effect.

In the TEG 10 of FIG. 1, identical NMOSFETs 12-1 to 12-N (N is an integer greater than one) are inserted as DUT in parallel between the Vcc terminal of a ring oscillator (RO) 11 and the wire connected to Vcc. In addition, in the TEG 10, identical PMOSFETs 13-1 to 13-N are inserted as DUT in parallel between the Vss terminal of the ring oscillator 11 and the wire connected to Vss.

In addition, output circuits 20-1 to 20-N included in a DUT selection circuit 14 are connected to the gates of the NMOSFETs 12-1 to 12-N, respectively, and output circuits 30-1 to 30-N included in the DUT selection circuit 14 are connected to the gates of the PMOSFETs 13-1 to 13-N, respectively. Note that in the following description, in a case where there is no need to particularly distinguish the NMOSFETs 12-1 to 12-N, they are collectively referred to as an NMOSFET 12. Similarly, the PMOSFETs 13-1 to 13-N, the output circuits 20-1 to 20-N, and the output circuits 30-1 to 30-N are collectively referred to as a PMOSFET 13, an output circuit 20, and an output circuit 30, respectively.

The output circuit 20 of the DUT selection circuit 14 includes a PMOSFET 21 and an NMOSFET 22 connected in series, and the gate of the NMOSFET 12 is connected between the PMOSFET 21 and the NMOSFET 22. The output circuit 20 selects the NMOSFET 12 as a DUT to be connected to the ring oscillator 11 by turning on the gate of the NMOSFET 12.

In addition, the output circuit 30 of the DUT selection circuit 14 includes an NMOSFET 31 and a PMOSFET 32 connected in series, and the gate of the PMOSFET 13 is connected between the NMOSFET 31 and the PMOSFET 32. The output circuit 30 selects the PMOSFET 13 as a DUT to be connected to the ring oscillator 11 by turning on the gate of the PMOSFET 13.

The gates of the NMOSFETs 12-2 to 12-N are also respectively connected to antenna parts 16-2 to 16-N that function as antennas in a plasma process. The gates of the PMOSFETs 13-2 to 13-N are also connected to antenna parts 17-2 to 17-N, respectively.

Hereinafter, in a case where there is no need to particularly distinguish the antenna parts 16-2 to 16-N, they are collectively referred to as an antenna part 16. Similarly, the antenna parts 17-2 to 17-N are collectively referred to as an antenna part 17.

The antenna part 16 and the antenna part 17 each include, for example, a poly-Si wire, a metal wire, a contact hole such as a via, and the like. In a case where a semiconductor device provided with the TEG 10 is a stacked image sensor, a wafer level chip-scale package (WLCSP), or the like, the antenna part 16 and the antenna part 17 each may include a through-silicon via (TSV) or the like.

The respective antenna parts 16 have different conditions (area ratio with respect to the gate of the NMOSFET 12 and the like), and the respective antenna parts 17 have different conditions (area ratio with respect to the gate of the PMOSFET 13 and the like).

In the TEG 10 configured as described above, the voltage applied to the Vcc terminal of the ring oscillator 11 fluctuates according to the threshold voltage Vth of the NMOSFET 12, and the oscillation frequency Freq of the ring oscillator 11 fluctuates. Therefore, it is possible to measure the threshold voltage Vth of each NMOSFET 12 by independently turning on the gates of the NMOSFETs 12 one by one, applying a voltage to the ring oscillator 11, and measuring the oscillation frequency Freq of the ring oscillator 11.

As a result, the PID effect on the NMOSFET 12 due to each antenna part 16 can be measured by comparing the threshold voltage Vth of the NMOSFET 12-1 that is not connected to an antenna part with the threshold voltages Vth of the NMOSFETs 12-2 to 12-N connected to the antenna parts 16. Similarly, it is also possible to measure the PID effect on the PMOSFET 13 due to each antenna part 17 in the manner used for the NMOSFET 12.

(Explanation of Operation Performed when NMOSFET 12-2 is on)

Figure 2:
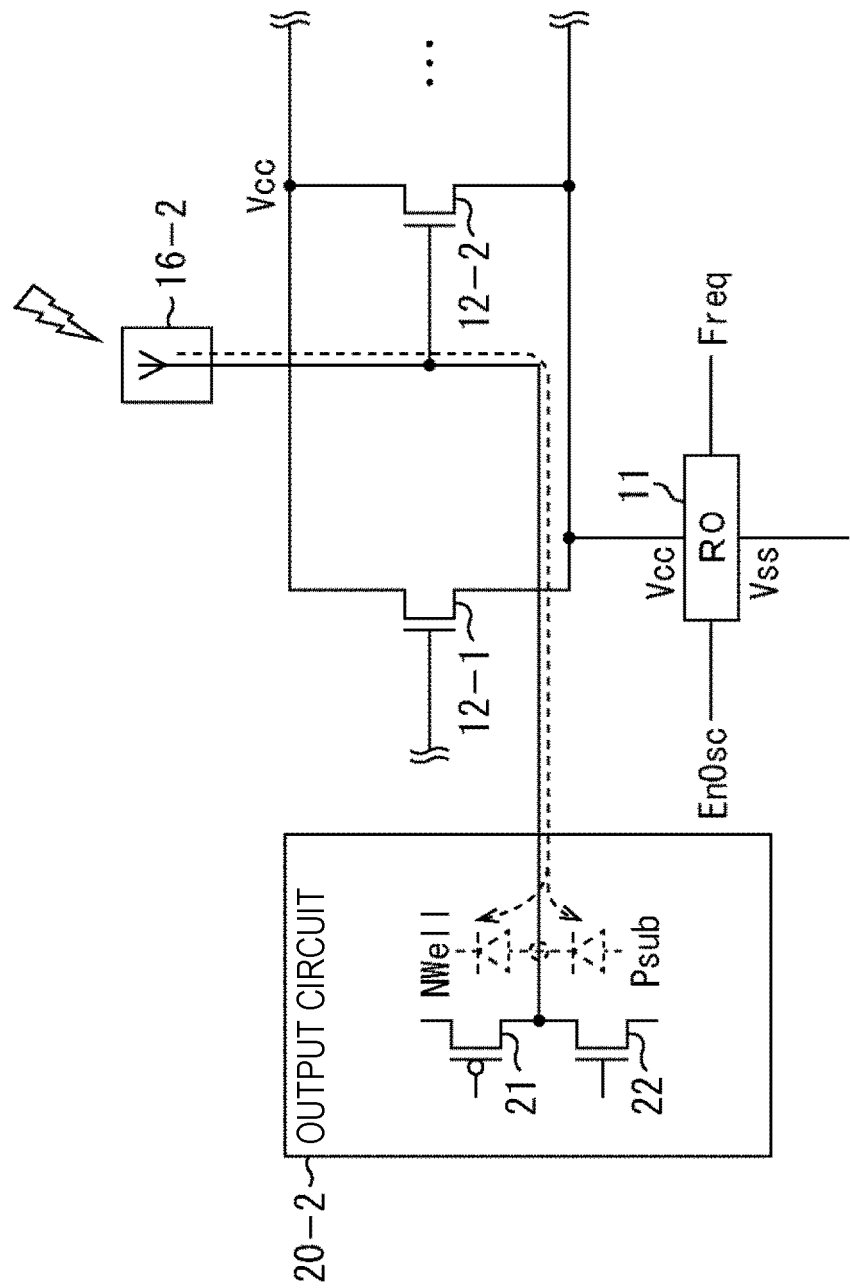

FIG. 2 is a diagram for explaining the operation performed when the NMOSFET 12-2 of FIG. 1 is on.

As illustrated in FIG. 2, since the output portion of the output circuit 20 serves as the output portion of the inverter, the output circuit 20 includes an n-type diffusion layer (N+ diffusion layer on Psub or Pwell) and a p-type diffusion layer (P+ diffusion layer on Nwell). Therefore, when the gate of the NMOSFET 12-2 is connected to both output circuit 20-2 and antenna part 16-2, the antenna part 16-2 is connected to the n-type diffusion layer and the p-type diffusion layer in the output circuit 20-2.

As a result, whether the PID charge is positive or negative, either the n-type diffusion layer or the p-type diffusion layer is biased in the forward direction. Therefore, one of the diffusion layers operates as a path for releasing the PID, and it is thus difficult to accurately measure the PID effect due to the antenna part 16-2. The same applies to the other NMOSFETs 12-3 to 12-N and the PMOSFETs 13-2 and 13-N.

Accordingly, the present disclosure provides, separately from the NMOSFET 12 and the PMOSFET 13, switching transistors for controlling the connection between the NMOSFET 12 and the ring oscillator 11 and between the PMOSFET 13 and the ring oscillator 11, thereby preventing PID from being released to the diffusion layers of the output circuit 20 and the output circuit 30. This enables accurate measurement of the PID effect.

One Embodiment (Exemplary Configuration of One Embodiment of Semiconductor System)

Figure 3:
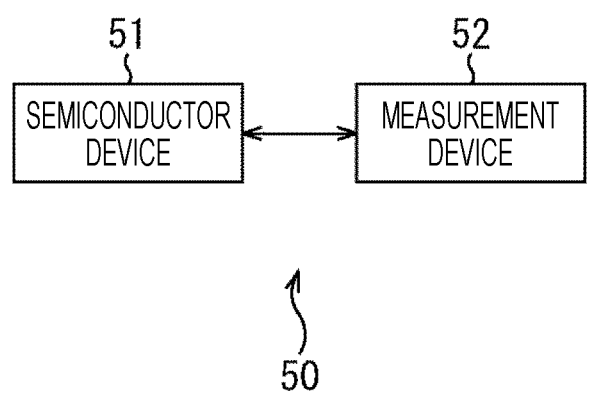
FIG. 3 is a block diagram illustrating an exemplary configuration of an embodiment of a semiconductor system to which the present disclosure is applied.

FIG. 3 is a block diagram illustrating an exemplary configuration of an embodiment of a semiconductor system to which the present disclosure is applied.

The semiconductor system 50 of FIG. 3 includes a semiconductor device 51 and a measurement device 52.

The semiconductor device 51 includes a semiconductor chip provided with a real circuit having a TEG and a MOSFET. The measurement device 52 measures the PID effect by controlling the TEG of the semiconductor device 51.

(Circuit Configuration Example of TEG)

Figure 4:
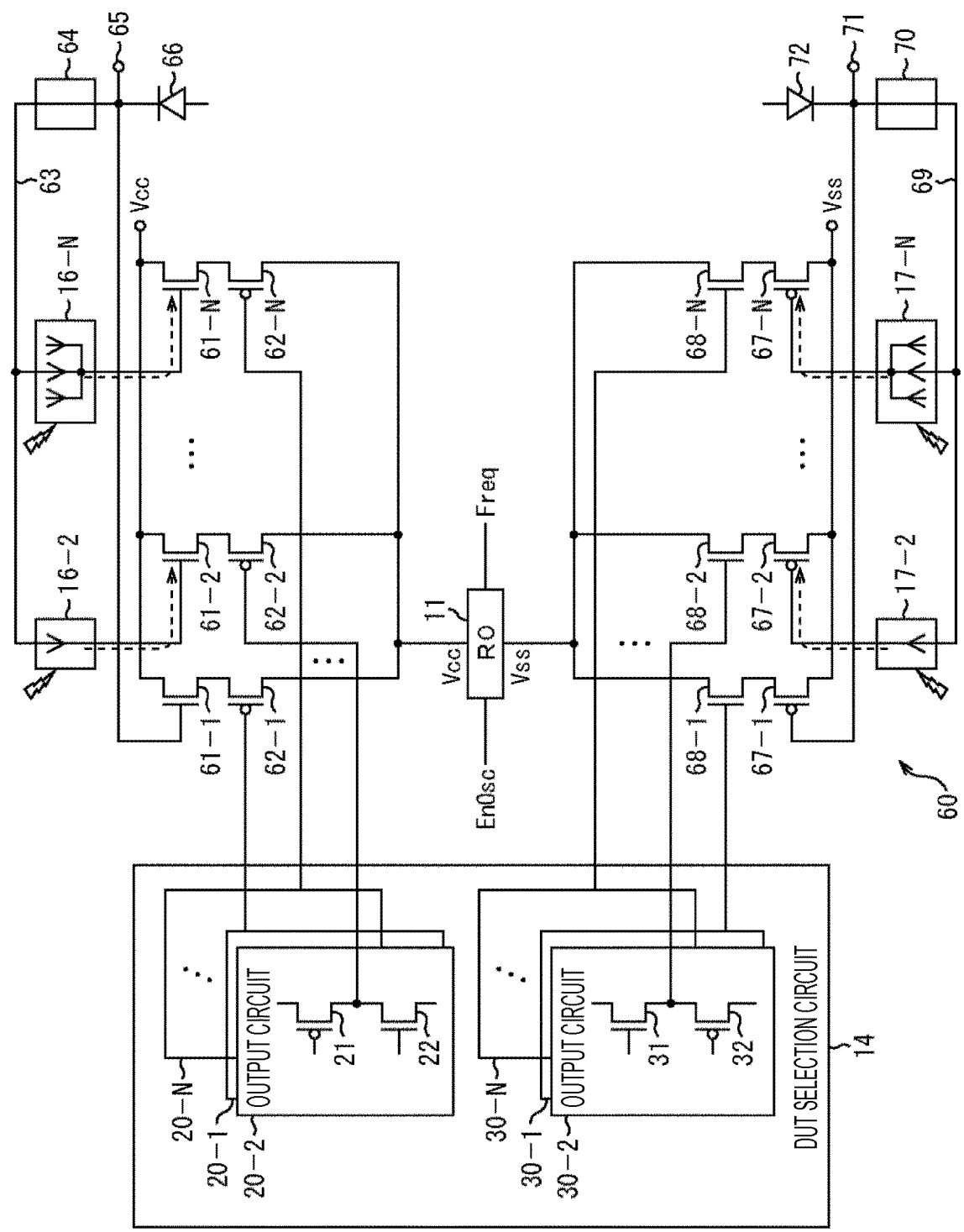
FIG. 4 is a diagram illustrating a circuit configuration example of a TEG of a semiconductor device of FIG. 3.

FIG. 4 is a diagram illustrating a circuit configuration example of the TEG of the semiconductor device 51 of FIG. 3.

Components illustrated in FIG. 4 identical to those in FIG. 1 are denoted by the same reference signs. Overlapping explanations are omitted as appropriate.

The configuration of the TEG 60 in FIG. 4 is different from that of the TEG 10 in FIG. 1 in that it includes NMOSFETs 61-1 to 61-N and PMOSFETs 62-1 to 62-N instead of the NMOSFETs 12-1 to 12-N, includes PMOSFETs 67-1 to 67-N and NMOSFETs 68-1 to 68-N instead of the PMOSFETs 13-1 to 13-N, and newly includes a wiring part 63 and a wiring part 69, a wiring part 64 and a wiring part 70, a PAD 65 and a PAD 71, and a protection circuit 66 and a protection circuit 72.

Note that in the following description, in a case where there is no need to particularly distinguish the NMOSFETs 61-1 to 61-N, they are collectively referred to as an NMOSFET 61. Similarly, the PMOSFETs 62-1 to 62-N, the PMOSFETs 67-1 to 67-N, and the NMOSFETs 68-1 to 68-N are collectively referred to as a PMOSFET 62, a PMOSFET 67, and an NMOSFET 68.

The NMOSFET 61 is a measuring transistor serving as a DUT for measuring the PID effect, and the PMOSFET 62 is a switch transistor that controls the connection between the NMOSFET 61 and the ring oscillator 11. The NMOSFET 61 and the PMOSFET 62 are connected in series between Vcc (power supply) and the Vcc terminal of the ring oscillator 11.

Specifically, the drain of the NMOSFET 61 is connected to VCC, and the source of the NMOSFET 61 is connected to the source of the PMOSFET 62. The gate of the NMOSFET 61-1 (reference transistor) is not connected to an antenna part but directly connected to the PAD 65. The gates of the NMOSFETs 61-2 to 61-N (measuring transistors) are connected to the PAD 65 (gate terminal) via the respective antenna parts 16-2 to 16-N, the wiring part 63, and the wiring part 64.

The source of the PMOSFET 62 is connected to the source of the NMOSFET 61, and the drain of the PMOSFET 62 is connected to the Vcc terminal of the ring oscillator 11. The gate of the PMOSFET 62 is connected to the output circuit 20 of the DUT selection circuit 14. The output circuit 20 selects the NMOSFET 61 connected to the PMOSFET 62 as a DUT to be connected to the ring oscillator 11 by turning on the gate of the PMOSFET 62.

The wiring part 63 is a wire or via formed in a wiring layer. The wiring layer is formed on the antenna part 16 and the wiring part 64 after the formation of the antenna part 16 and the wiring part 64. Therefore, the PID effect on the PAD 65 other than the NMOSFET 61 as a DUT is minimized, and the accuracy of the measurement of the PID effect can be further improved. The protection circuit 66 is connected to the wiring part 63 via the wiring part 64.

The wiring part 64 is a wire, via, or the like arranged in the same layer as the antenna part 16, and connects the antenna part 16 and the PAD 65.

The PAD 65 supplies a predetermined potential to the gate of the NMOSFET 61. The protection circuit 66 is connected to the wiring part 63 via the wiring part 64, and protects the wiring part 63 from PID by releasing the PID.

The PMOSFET 67 is a measuring transistor serving as a DUT for measuring the PID effect, and the NMOSFET 68 is a switch transistor that controls the connection between the PMOSFET 67 and the ring oscillator 11. The PMOSFET 67 and the NMOSFET 68 are connected in series between VSS (ground) and the Vss terminal of the ring oscillator 11.

Specifically, the drain of the PMOSFET 67 is connected to VSS, and the source of the PMOSFET 67 is connected to the source of the NMOSFET 68. The gate of the PMOSFET 67-1 (reference transistor) is not connected to an antenna part but directly connected to the PAD 71. The gates of the PMOSFETs 67-2 to 67-N (measuring transistors) are connected to the PAD 71 (gate terminal) via the respective antenna parts 17-2 to 17-N, the wiring part 69, and the wiring part 70.

The source of the NMOSFET 68 is connected to the source of the PMOSFET 67, and the drain of the NMOSFET 68 is connected to the VSS terminal of the ring oscillator 11. The gate of the NMOSFET 68 is connected to the output circuit 30 of the DUT selection circuit 14. The output circuit 30 selects the PMOSFET 67 connected to the NMOSFET 68 as a DUT to be connected to the ring oscillator 11 by turning on the gate of the NMOSFET 68.

The wiring part 69 is a wire or via formed in a wiring layer. The wiring layer is formed on the antenna part 17 and the wiring part 70 after the formation of the antenna part 17 and the wiring part 70. As a result, the PID effect on the PAD 71 other than the PMOSFET 67 as a DUT is minimized, and the accuracy of the measurement of the PID effect can be further improved. The protection circuit 72 is connected to the wiring part 69 via the wiring part 70.

The wiring part 70 is a wire, via, or the like arranged in the same layer as the antenna part 17, and connects the wiring part 70 and the PAD 71.

The PAD 71 supplies a predetermined potential to the gate of the PMOSFET 67. The protection circuit 72 is connected to the wiring part 69 via the wiring part 70, and protects the wiring part 69 from PID by releasing the PID.

In the TEG 60 configured as described above, the NMOSFET 61 (PMOSFET 67) serving as a measuring transistor whose gate is connected to the antenna part 16 and the PMOSFET 62 (NMOSFET 68) serving as a switch transistor whose gate is connected to the output circuit 20 (30) are separately provided. Therefore, the antenna part 16 (17) is not connected to the diffusion layer of the output circuit 20 (30). Thus, it is possible to prevent the PID generated in the antenna part 16 (17) from being released to the diffusion layer of the output circuit 20 (30). This enables accurate measurement of the PID effect due to the antenna part 16 (17).

Note that the switch transistor may include a pass gate. In this case, the resistance is reduced. Further, in the TEG 60, the measuring transistor and the switch transistor may be connected to only one of the Vcc terminal and the Vss terminal of the ring oscillator 11.

<Exemplary Configuration of Measurement Device>

Figure 5:
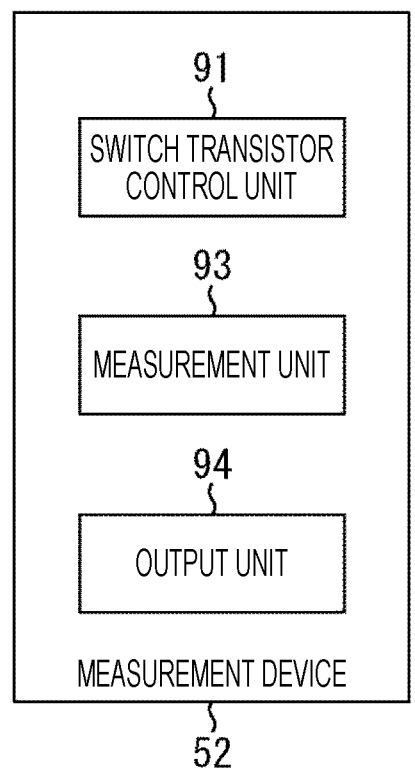
FIG. 5 is a block diagram illustrating an exemplary configuration of a measurement device of FIG. 3.

FIG. 5 is a block diagram illustrating an exemplary configuration of the measurement device 52 of FIG. 3.

The measurement device 52 includes a switch transistor control unit 91, a measurement unit 93, and an output unit 94.

The switch transistor control unit 91 controls the DUT selection circuit 14 so as to sequentially apply voltages to the gates of the PMOSFETs 62 and the NMOSFETs 68 (FIG. 4) serving as switch transistors to sequentially turn on the gates.

The measurement unit 93 measures the oscillation frequency Freq output from the ring oscillator 11 when the PMOSFET 62 or the NMOSFET 68 is turned on under the control of the switch transistor control unit 91.

The output unit 94 sets the oscillation frequency Freq measured by the measurement unit 93 when the PMOSFET 62-1 is turned on as the ideal value of the oscillation frequency Freq that is measured by the measurement unit 93 when the PMOSFETs 62-2 to 62-N are turned on. Then, the output unit 94 outputs the difference between the oscillation frequency Freq measured by the measurement unit 93 when each of the PMOSFETs 62-2 to 62-N is turned on and the ideal value of the oscillation frequency Freq as a measurement result of the PID effect on each of the NMOSFETs 61-2 to 61-N.

The output unit 94 sets the oscillation frequency Freq measured by the measurement unit 93 when the NMOSFET 68-1 is turned on as the ideal value of the oscillation frequency Freq that is measured by the measurement unit 93 when the NMOSFETs 68-2 to 68-N are turned on. Then, the output unit 94 outputs the difference between the oscillation frequency Freq measured by the measurement unit 93 when each of the NMOSFETs 68-2 to 68-N is turned on and the ideal value of the oscillation frequency Freq as a measurement result of the PID effect on each of the PMOSFETs 67-2 to 67-N.

That is, the voltage applied to the Vcc terminal (Vss terminal) of the ring oscillator 11 fluctuates according to the threshold voltage Vth of the NMOSFET 61 (PMOSFET 68) which is a DUT, and the oscillation frequency Freq of the ring oscillator 11 fluctuates. Therefore, the measurement device 52 outputs, as a measurement result of the PID effect on each of the NMOSFETs 61-2 to 61-N (each of the PMOSFETs 67-2 to 67-N), the difference between the oscillation frequency Freq and the ideal value that occurs when each of the PMOSFETs 62-2 to 62-N (each of the NMOSFETs 68-2 to 68-N) is turned on and each of the NMOSFETs 61-2 to 61-N (each of the PMOSFETs 67-2 to 67-N) is connected to the Vcc terminal (Vss terminal) of the ring oscillator 11.

Note that the TEG 60 may not include the NMOSFET 61-1, the PMOSFET 62-1, and the output circuit 20-1 and may not include the PMOSFET 67-1, the NMOSFET 68-1, and the output circuit 30-1. In this case, the oscillation frequency Freq corresponding to the known characteristics of the NMOSFETs (PMOSFETs) constituting the NMOSFETs 61-2 to 61-N (PMOSFETs 67-2 to 67-N) is set as the ideal value.

(Explanation of Process of Measurement Device)

Figure 6:
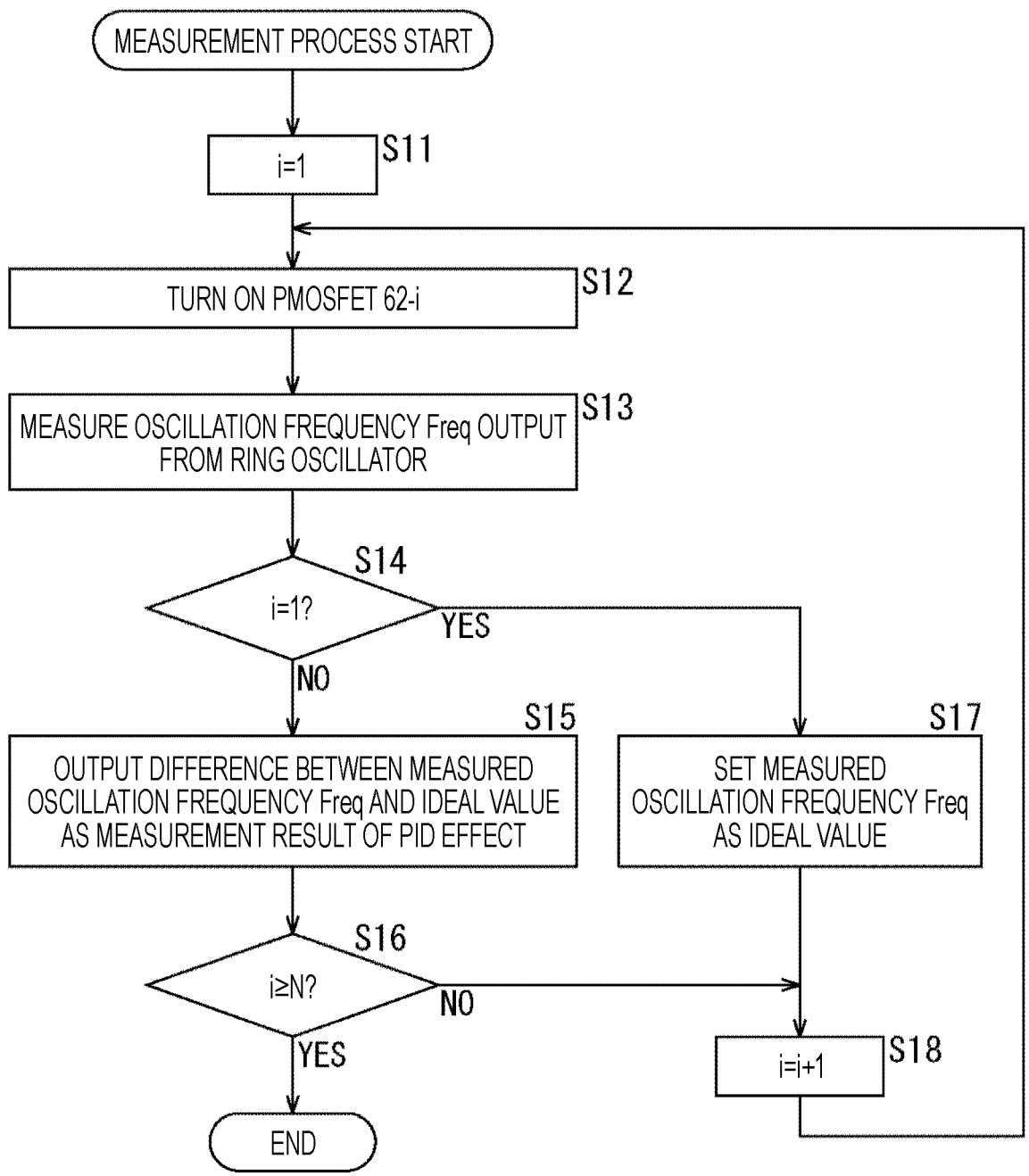
FIG. 6 is a flowchart for explaining a measurement process of the measurement device of FIG. 5.

FIG. 6 is a flowchart for explaining a measurement process performed by the measurement device 52 of FIG. 5 for measuring the PID effect on the NMOSFETs 61-2 to 61-N.

In step S11 of FIG. 6, the switch transistor control unit 91 of the measurement device 52 sets the count value i to one.

In step S12, the switch transistor control unit 91 controls the DUT selection circuit 14 to turn on the PMOSFET 62-$i$.

In step S13, the measurement unit 93 measures the oscillation frequency Freq output from the ring oscillator 11.

In step S14, the switch transistor control unit 91 determines whether the count value i is one. In a case where it is determined in step S14 that the count value i is not one, the process proceeds to step S15.

In step S15, the output unit 94 outputs the difference between the oscillation frequency Freq measured in step S13 and the ideal value of the oscillation frequency Freq as a measurement result of the PID effect on the NMOSFET 61-$i$.

In step S16, the switch transistor control unit 91 determines whether the count value i is equal to or greater than N, that is, whether all the oscillation frequencies Freq of the PMOSFETs 62-1 to 62-N have been measured. In a case where it is determined in step S16 that the count value i is not equal to or greater than N, that is, in a case where not all the oscillation frequencies Freq of the PMOSFETs 62-1 to 62-N have been measured, the process proceeds to step S18.

On the other hand, in a case where it is determined in step S14 that the count value i is one, the output unit 94 sets the oscillation frequency Freq measured in step S13 as the ideal value of the oscillation frequency Freq in step S17.

In step S18, the switch transistor control unit 91 increments the count value i by one, and returns the process to step S12. Then, the process of steps S12 to S18 is repeated until the count value i becomes N.

In addition, in a case where it is determined in step S16 that the count value i is equal to or greater than N, that is, in a case where all the oscillation frequencies Freq of the PMOSFETs 62-1 to 62-N have been measured, the process is terminated.

The measurement process for measuring the PID effect on the PMOSFETs 67-2 to 67-N is similar to the measurement process in FIG. 6, except that the NMOSFET 61 and the PMOSFET 62 are replaced by the PMOSFET 67 and the NMOSFET 68, respectively.

As described above, in the semiconductor device 51, the NMOSFET 61 (PMOSFET 67) whose gate is connected to the antenna part 16 (17) and the PMOSFET 62 (NMOSFET 68) that controls the connection between the NMOSFET 61 (PMOSFET 67) and the ring oscillator 11 are connected in series between Vcc (Vss) and the ring oscillator 11.

Therefore, the antenna part 16 (17) and the output circuit (30) are not connected to each other, which can prevent PID due to the antenna part 16 (17) from being released to the output circuit 20 (30). This enables accurate measurement of the PID effect. As a result, the operation of the semiconductor device 51 can be reliably guaranteed by creating a circuit design or the like in consideration of optimization of the process conditions and device structure and of fluctuations in the threshold voltage Vth on the basis of the measured PID effect.

In addition, the NMOSFETs 61 (PMOSFETs 67) serving as DUT are connected in parallel between Vcc (Vss) and the ring oscillator 11. Accordingly, the area of the TEG 60 per DUT can be reduced as compared with a case where a PAD connected by wires to the gate, source, and drain of each MOSFET and to each terminal of the substrate is provided for each DUT to directly measure the threshold voltage Vth of each DUT.

Consequently, the TEG 60 can be arranged in the semiconductor chip constituting the semiconductor device 51. As a result, for example, it is possible to manage the time-series tendency of the PID effect in the semiconductor device 51 and select the normally operating semiconductor device 51. Further, it is possible to reduce the size of the semiconductor device 51 provided with the TEG 60.

Note that in the present description, a system means a collection of a plurality of components (devices, modules (parts), and the like), whether all the components exist in the same housing or not. Therefore, both a plurality of devices housed in separate housings and coupled via a wire and a single device including a plurality of modules housed in a single housing are systems.

In addition, the effects described in the present description are only examples, and the effects of the present disclosure are not limited to these effects. Additional effects may also be obtained.

Furthermore, the embodiment of the present disclosure is not limited to the above-mentioned embodiment, and can be variously changed in a range not departing from the gist of the present disclosure.

In addition, the present disclosure can also be configured as follows.

(1)
A semiconductor device including:
a measuring transistor whose gate is connected to an antenna part that functions as an antenna in a plasma process; and
a switch transistor that controls connection between the measuring transistor and a ring oscillator.

(2)
The semiconductor device according to (1), in which
the gate of the measuring transistor is connected to a gate terminal via the antenna part, and
a wire between the antenna part and the gate terminal is formed in a wiring layer located on the antenna part.

(3)
The semiconductor device according to (2), in which
a protection circuit that protects the wire from damage due to the plasma process is connected to the wire.

(4)
The semiconductor device according to (1), in which
a plurality of the measuring transistors and a plurality of the switch transistors are provided.

(5)
The semiconductor device according to (4), in which
the gates of the plurality of measuring transistors are connected to a common gate terminal via the antenna parts, and
a wire between each of the antenna parts for the plurality of measuring transistors and the common gate terminal is formed in a wiring layer located on the antenna part.

(6)
The semiconductor device according to (5), in which
a protection circuit that protects the wire from damage due to the plasma process is connected to the wire.

(7)
The semiconductor device according to any of (4) to (6), in which
a part of the measuring transistor and a part of the switch transistor are connected in series between a power supply and the ring oscillator, and
another part of the measuring transistor and another part of the switch transistor are connected in series between ground and the ring oscillator.

(8)
The semiconductor device according to any of (1) to (7), further including:
a reference transistor whose gate is not connected to the antenna part; and
a reference switch transistor that controls connection between the reference transistor and the ring oscillator.

(9)
The semiconductor device according to any of (1) to (8), in which
the switch transistor includes a pass gate.

(10)
A measurement device including:
a switch transistor control unit that turns on a switch transistor of a semiconductor device, the semiconductor device including: a measuring transistor whose gate is connected to an antenna part that functions as an antenna in a plasma process; and the switch transistor that controls connection between the measuring transistor and a ring oscillator;
a measurement unit that measures an oscillation frequency output from the ring oscillator when the switch transistor is turned on by the switch transistor control unit; and an output unit that outputs a difference between the oscillation frequency measured by the measurement unit and an ideal value of the oscillation frequency.

(11)

The measurement device according to (10), in which a plurality of the measuring transistors and a plurality of the switch transistors are provided, and the switch transistor control unit sequentially turns on the plurality of switch transistors.

(12)

A measurement method for a measurement device including:

a switch transistor control step of turning on a switch transistor of a semiconductor device, the semiconductor device including: a measuring transistor whose gate is connected to an antenna part that functions as an antenna in a plasma process; and the switch transistor that controls connection between the measuring transistor and a ring oscillator;

a measurement step of measuring an oscillation frequency output from the ring oscillator when the switch transistor is turned on in a process of the switch transistor control step; and an output step of outputting a difference between the oscillation frequency measured in a process of the measurement step and an ideal value of the oscillation frequency.

(13)

A semiconductor system including:

a semiconductor device having:

a measuring transistor whose gate is connected to an antenna part that functions as an antenna in a plasma process; and a switch transistor that controls connection between the measuring transistor and a ring oscillator; and a measurement device having:

a switch transistor control unit that turns on the switch transistor of the semiconductor device;

a measurement unit that measures an oscillation frequency output from the ring oscillator when the switch transistor is turned on by the switch transistor control unit; and an output unit that outputs a difference between the oscillation frequency measured by the measurement unit and an ideal value of the oscillation frequency.

REFERENCE SIGNS LIST

11 Ring oscillator
16-2 to 16-N, 17-2 to 17-N Antenna part
50 Semiconductor system
51 Semiconductor device
52 Measurement device
61-1 to 61-N NMOSFET
62-1 to 62-N PMOSFET
63 Wiring part
65 PAD
66 Protection circuit
67-1 to 67-N PMOSFET
68-1 to 68-N NMOSFET
69 Wiring part
71 PAD
72 Protection circuit
91 Switch transistor control unit
93 Measurement unit
94 Output unit

The invention claimed is:

1. A semiconductor device, comprising:
a ring oscillator;
a gate terminal;
an antenna part configured to operate as an antenna in a plasma process;
a first measuring transistor, wherein
a gate of the first measuring transistor is connected to the antenna part, and
the gate of the first measuring transistor is connected to the gate terminal of the semiconductor device via the antenna part; and
a first switch transistor configured to control a connection between the first measuring transistor and the ring oscillator, wherein a source of the first switch transistor is connected to a source of the first measuring transistor.

2. The semiconductor device according to claim 1, further comprising
a wiring part between the antenna part and the gate terminal, wherein the wiring part is on the antenna part.

3. The semiconductor device according to claim 2, further comprising
a protection circuit configured to control the plasma process, to prevent damage to the wiring part by the plasma process, wherein the protection circuit is connected to the wiring part.

4. The semiconductor device according to claim 1, further comprising:
a plurality of antenna parts including the antenna part;
a first plurality of measuring transistors including the first measuring transistor, wherein
the first plurality of measuring transistors is connected in parallel between a power supply and the ring oscillator, and
a gate of each measuring transistor of the first plurality of measuring transistors is connected to a corresponding antenna part of the plurality of antenna parts; and
a first plurality of switch transistors including the first switch transistor, wherein
a source of each switch transistor of the first plurality of switch transistors is connected to a source of a corresponding measuring transistor of the first plurality of measuring transistors, and
a drain of each switch transistor of the first plurality of switch transistors is connected to a power supply terminal of the ring oscillator.

5. The semiconductor device according to claim 4, further comprising a wiring part between the plurality of antenna parts and the gate terminal, wherein
the gate of each measuring transistor of the first plurality of measuring transistors is connected to the gate terminal via the corresponding antenna part, and
the wiring part is on the plurality of antenna parts.

6. The semiconductor device according to claim 5, further comprising
a protection circuit configured to control the plasma process, to prevent damage to the wiring part by the plasma process, wherein the protection circuit is connected to the wiring part.

7. The semiconductor device according to claim 4, further comprising:
a second plurality of measuring transistors; and
a second plurality of switch transistors, wherein
each switch transistor of the second plurality of switch transistors is connected in series with a corresponding measuring transistor of the second plurality of measuring transistors between ground and the ring oscillator.

8. The semiconductor device according to claim 1, further comprising:
a second measuring transistor disconnected from the antenna part; and
a second switch transistor configured to control a connection between the second measuring transistor and the ring oscillator.

9. The semiconductor device according to claim 1, wherein the first switch transistor includes a pass gate.

10. A measurement device, comprising:
a switch transistor control circuit configured to turn on a switch transistor of a semiconductor device, wherein the semiconductor device includes:
a measuring transistor, wherein
a gate of the measuring transistor is connected to an antenna part, and
the antenna part that operate as an antenna in a plasma process; and
the switch transistor that controls a connection between the measuring transistor and a ring oscillator,
the switch transistor control circuit is communicatively coupled to the switch transistor;
a measurement circuit configured to measure an oscillation frequency output from the ring oscillator, wherein
the oscillation frequency is measured based on the turn on of the switch transistor, and
the measurement circuit is communicatively coupled to the measuring transistor; and
an output circuit configured to output a difference between a first value of the measured oscillation frequency and a second value of the measured oscillation frequency, wherein the output circuit is communicatively coupled to the ring oscillator.

11. The measurement device according to claim 10, wherein
the semiconductor device further includes:
a plurality of antenna parts including the antenna part;
a plurality of measuring transistors connected between a power supply and the ring oscillator, wherein a gate of each measuring transistor of the plurality of measuring transistors is connected to a corresponding antenna part of the plurality of the antenna parts; and
a plurality of switch transistors, wherein
a drain of each switch transistor of the plurality of switch transistors is connected to a power supply terminal of the ring oscillator, and
the switch transistor control circuit is further configured to sequentially turn on the plurality of switch transistors.

12. A measurement method, comprising:
turning on a switch transistor of a semiconductor device by a switch transistor control circuit, wherein
the semiconductor device includes:
a measuring transistor, wherein
a gate of the measuring transistor is connected to an antenna part, and
the antenna part that operates as an antenna in a plasma process; and
the switch transistor that controls a connection between the measuring transistor and a ring oscillator;
measuring, by a measuring circuit, an oscillation frequency output from the ring oscillator, wherein
the oscillation frequency is measured based on the turning on of the switch transistor, and
the measuring circuit is communicatively coupled to the measuring transistor; and
outputting, by an output circuit, a difference between a first value of the measured oscillation frequency and a second value of the measured oscillation frequency.

13. A semiconductor system, comprising:
a semiconductor device that comprises:
a ring oscillator;
an antenna part configured to operate as an antenna in a plasma process;
a measuring transistor, wherein
a gate of the measuring transistor is connected to the antenna part; and
a switch transistor configured to control a connection between the measuring transistor and the ring oscillator, wherein a source of the switch transistor is connected to a source of the measuring transistor; and
a measurement device that comprises:
a switch transistor control circuit configured to turn on the switch transistor of the semiconductor device;
a measurement circuit configured to measure an oscillation frequency output from the ring oscillator, wherein
the oscillation frequency is measured based on the turn on of the switch transistor, and
the measurement circuit is communicatively coupled to the measuring transistor; and
an output circuit configured to output a difference between a first value of the measured oscillation frequency and a second value of the measured oscillation frequency, wherein the output circuit is communicatively coupled to the ring oscillator.

* * * * *